United States Patent [19]

Kataoka et al.

[11] Patent Number: 4,805,063
[45] Date of Patent: Feb. 14, 1989

[54] FAULT DETECTOR FOR DETECTING FAULTS IN A DC CAPACITOR CIRCUIT

[75] Inventors: Michio Kataoka; Shigenori Higashino, both of Hyogo, Japan

[73] Assignee: Mitsubishi Denki Kabushiki Kaisha, Tokyo, Japan

[21] Appl. No.: 40,857

[22] Filed: Apr. 21, 1987

[30] Foreign Application Priority Data

Apr. 22, 1986 [JP] Japan ................... 61-91191

[51] Int. Cl.$^4$ .............................. H02H 7/16
[52] U.S. Cl. ........................ 361/16; 361/17; 324/60 C
[58] Field of Search ................. 361/15–17; 324/60 C, 60 R, 548; 340/661

[56] References Cited

U.S. PATENT DOCUMENTS

| | | | |
|---|---|---|---|
| 2,550,119 | 4/1951 | Marborg et al. | 361/15 |
| 3,143,687 | 8/1964 | Hiertberg et al. | 361/16 |
| 4,093,915 | 6/1978 | Briefer | 324/60 R |
| 4,278,971 | 7/1981 | Yasui et al. | 340/661 |
| 4,401,942 | 8/1983 | Renz | 324/60 C |
| 4,419,621 | 12/1983 | Becker et al. | 324/60 C |

OTHER PUBLICATIONS

Electric Lighting & Facilities in Railways, "Electric Power and Railroad", vol. 28, No. 6 (278), May 25, 1978, pp. 29–32.

Primary Examiner—A. D. Pellinen
Assistant Examiner—Jeffrey A. Gaffin
Attorney, Agent, or Firm—Bernard, Rothwell & Brown

[57] ABSTRACT

A fault detector for detecting faults in a DC capacitor circuit connected to the DC buses of an inverter circuit using semiconductor device for converting direct current into alternating current to suppress the voltage pulsation and comprising a plurality of parallel-connected capacitor circuits each having a plurality of series-connected DC capacitors. The fault detector comprises a comparison means connected to the junctions of the series-connected DC capacitors to compare the respective potentials of the parallel-connected capacitor circuits, and detects the short-circuit and time-aging of the DC capacitors of the parallel-connected capacitor circuits rapidly on the basis of the output signal of the comparison means.

15 Claims, 4 Drawing Sheets

FAULT DETECTOR FOR DETECTING FAULTS IN A DC CAPACITOR CIRCUIT

BACKGROUND OF THE INVENTION

1. Field of the Invention

The present invention relates to a fault detector for detecting faults in a DC capacitor circuit incorporated into an inverter circuit which converts direct current into alternating current by means of semiconductor devices.

2. Description of the Prior Art

Generally, internal short-circuit and capacity reduction due to time aging are the most likely faults in a DC capacitor. The internal short-circuit of the capacitor causes a variation of the DC voltage of the inverter circuit, and hence the inverter circuit is provided with fuses to protect the related equipments and circuits.

FIG. 1 is a circuit diagram of a fault detecting circuit for detecting faults in the DC capacitor of an inverter, introduced in "Electric Power and Railroad", Vol. 28, No. 6 (278), pp. 29–31. As illustratred in FIG. 1, this known inverter circuit 8 comprises DC capacitors 1 and 2 connected in series, voltage dividing resistances 3 and 4 for equalizing the respective voltages of the DC capacitors 1 and 2, fuses 5 that melt and break the circuit when the DC capacitors 1 and/or 2 are short-circuited, fuse fusion detectors 6 and DC buses 7 of the inverter circuit 8. This inverter circuit 8 comprises a plurality of component circuits each comprising, as the principal elements, the DC capacitors 1 and 2, and the fuse 5, and connected in parallel to the DC buses 7.

The manner of operation of this known inverter circuit 8 will be described hereinafter. During a normal state when the DC capacitors 1 and 2 are not short-circuited, the fuse fusion detectors 6 do not operate. Suppose that one of the DC capacitors 1 and 2 short-circuits. Then, the voltage of the busses 7, namely, a voltage twice the normal voltage, is applied to the other DC capacitor. In some cases, the abnormal voltage exceeds the rated voltage of the DC capacitor, which, in some cases, causes the latter DC capacitor to short-circuit, and thereby an overcurrent flows through the DC capacitors 1 and 2, and the fuse 5, so that the fuse 5 melts and breaks the circuit. Then, the fuse fusion detector 6 of the inverter circuit 8 detects the fusion of the fuse 5.

Since the conventional fault detector for detecting faults in a DC capacitor circuit is thus constituted, a time of several tens of milliseconds to several hundreds of milliseconds elapses from the moment of occurrence of the short-circuit of the busses 7 of the inverter circuit 8 before the fuse fusion detector 6 functions delaying the detection of the short-circuit of the DC buses 7. Thus, the conventional fault detector is incapable of instantaneous detection of such a fault.

Furthermore, the above-mentioned conventional fault detector is designed to detect only the internal short-circuit of the DC capacitor, and hence the fault detector is incapable of dealing with the other fault, namely, the variation of the capacitance of the DC capacitor circuit attributable to time aging.

SUMMARY OF THE INVENTION

Accordingly, it is an object of the present invention to provide a fault detector for detecting faults in DC capacitors, capable of instantaneous detection of the anomalous condition of a DC capacitor circuit, such as an internal short-circuit, and capable of dealing with the internal abnormality of the DC capacitor circuit.

It is another object of the present invention to provide a fault detector for detecting faults in DC capacitors, capable of detecting main internal abnormalities including the variation of the capacity of the DC capacitor other than the short-circuit of the DC capacitors.

A fault detector for detecting faults in a DC capacitor circuit, according to the present invention, comprises a comparison means which compares the potential of the junction of series-connected capacitors with that of the junction of other series-connected capacitors of the same DC capacitor circuit.

BRIEF DESCRIPTION OF THE DRAWINGS

FIG. 1 is a circuit diagram of a fault detector for detecting faults in DC capacitors incorporated into an inverter or the like;

DETAILED DESCRIPTION OF THE PREFERRED EMBODIMENT

A fault detector for detecting faults in a DC capacitor circuit, in a preferred embodiment, according to the present invention will be described hereinafter with reference to the accompanying drawing.

Figure 1:
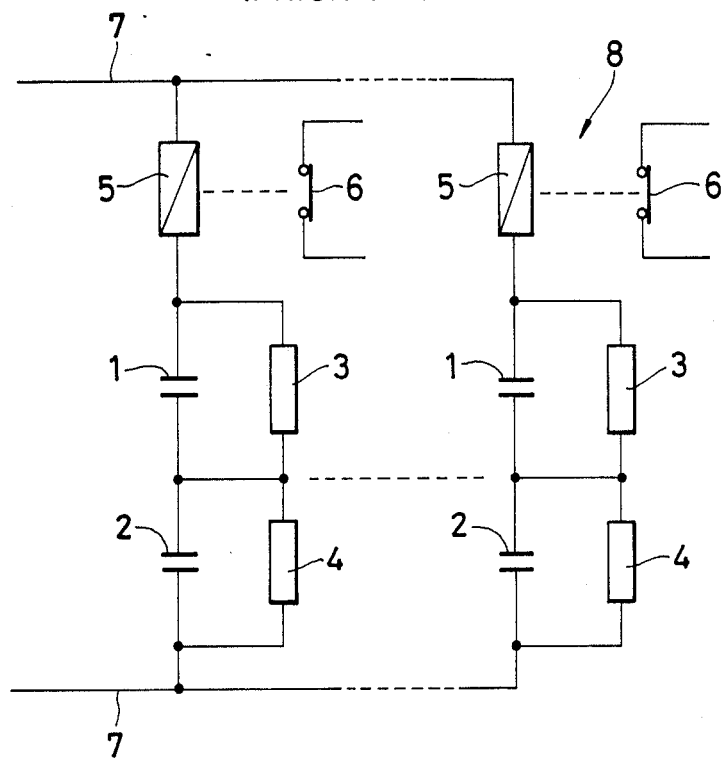
Figure 2:
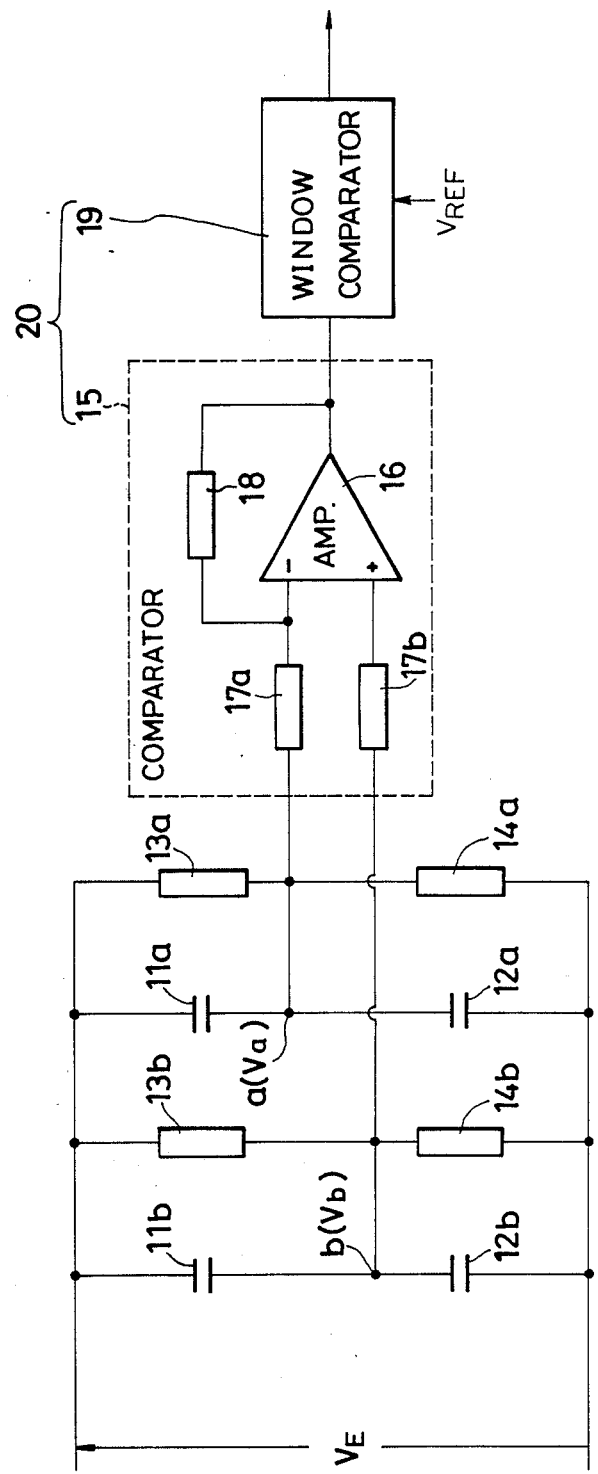
FIG. 2 is a circuit diagram of a fault detector, in a preferred embodiment, according to the present invention for detecting faults in DC capacitors.

Referring to FIG. 2, there are shown series-connected DC capacitors 11a and 12a, series-connected DC capacitors 11b and 12b, voltage dividing resistances 13a and 14a for equalizing the voltages of the DC capacitors 11a and 12a, voltage dividing resistances 13b and 14b for equalizing the voltages of the DC capacitors 11b and 12b, a comparator 15 which compares the potential of the junction a of the DC capacitors 11a and 12a, and the potential of the junction b of the DC capacitors 11b and 12b, a differential amplifier 16, namely, the principal component of the comparator 15, resistances 17a and 17b connected to the inputs of the differential amplifier 16, a feedback resistance 18 for the differential amplifier 16, and a window comparator 19 which determines whether or not the output signal of the differential amplifier is greater than a reference potential. The comparator 15 and the window comparator 19 constitute a comparison unit 20.

The manner of operation of the thus constituted fault detector will be described hereinafter. The potential difference between the junction a of the series-connected DC capacitors 11a and 12a, and the junction b of the series-connected DC capacitors 11b and 12b is several volts or less when the DC capacitors are normal. Suppose that the DC capacitor 11a has short-circuited. Then, the potential difference $V_a - V_b$, namely, the difference between the voltage $V_a$ of the junction a and the voltage $V_b$ of junction b is approximately half of the voltage $V_E$ applied to the circuit, namely, approximately $V_E/2$. Then, the differential amplifier 16 produces a voltage corresponding to the potential difference and the window comparator 19 detects the failure of the DC capacitor.

The potential difference $V_a - V_b$ increases also when the capacity of any one of the DC capacitors 11a, 12a, 11b and 12b varies significantly due to time aging, and the differential amplifier 16 produces a voltage, and thereby the failure of the DC capacitor can be detected.

Since the fault detector employs the window comparator 19 for detecting a fault through the comparison of the output signal of the differential amplifier 16 with a fixed reference potential, the fault detector is able to detect surely a fault in any one of the DC capacitors 11a, 12a, 11b and 12b.

The fault detector described hereinbefore is a preferred embodiment of the present invention shown only by way of example, and hence many variations and changes are possible in the invention for the same objects, constitution and effects without departing from the scope thereof.

For example, although the present invention has been described hereinbefore as applied to a DC capacitor circuit comprising a parallel arrangement of two series-connected DC capacitors 11a and 12a and two series-connected DC capacitors 11b and 12b, the present invention is applicable also to a DC capacitor circuit comprising a parallel arrangement of several sets of three series-connected DC capacitors.

Furthermore, an isolating amplifier may be employed instead of the differential amplifier 16, for detecting the difference between the voltage $V_a$ of the junction a and the voltage $V_b$ of the junction b.

Still further, a level comparator may be employed instead of the window comparator 19, for comparing the output signal of the comparator 15 with the reference potential to detect a fault in the DC capacitors.

Figure 3:
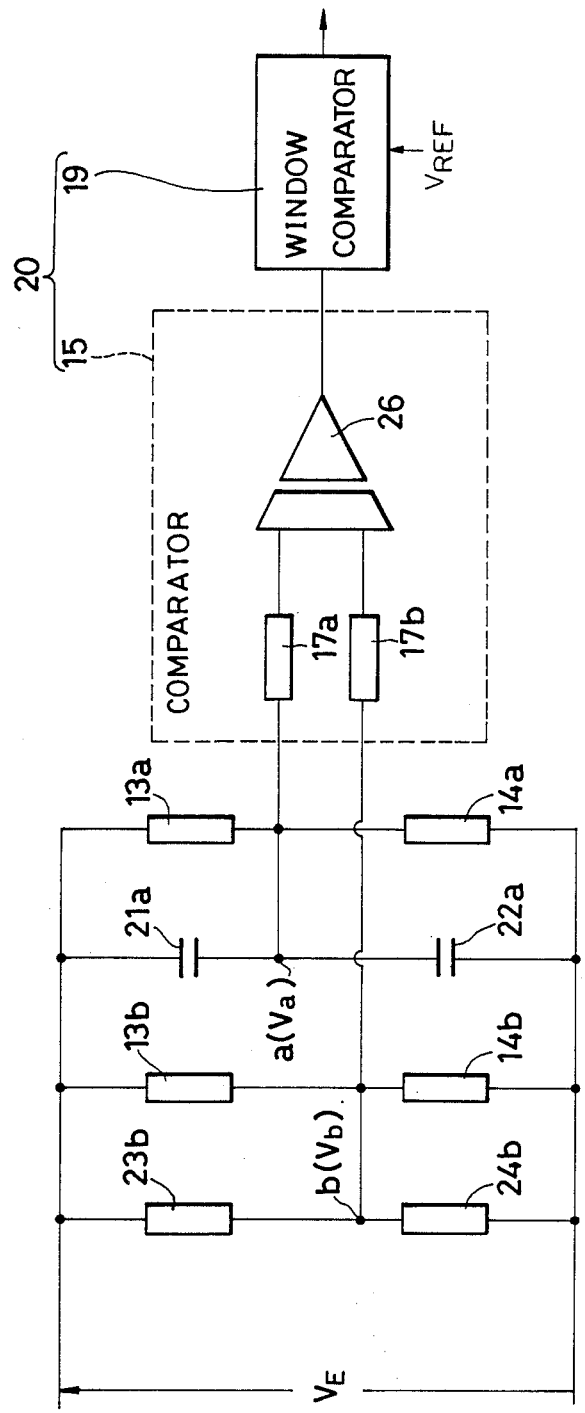
FIG. 3 is a circuit diagram of a fault detector, in another embodiment, according to the present invention for detecting faults in a DC capacitor circuit.

In the foregoing embodiment shown in FIG. 2, series-connected DC capacitors 11b and 12b are connected in parallel to the respective series-connected sets of the circuit elements 11a and 12a, the circuit elements 13a and 14a, and the circuit elements 13b and 14b. However, the present invention is not limited to such an arrangement. In another embodiment of the present invention shown in FIG. 3, the series-connected set of the DC capacitors 11b and 12b is substituted by the series-connected set of two resistors 23b and 24b. It is also possible to detect the voltage difference between a voltage $V_b$ at the junction b of the resistors 23b and 24b, and a voltage $V_a$ at the junction a of the DC capacitors 21a and 22a. In FIG. 3, indicated at 26 is an insulating amplifier. Like reference characters designate like or corresponding parts through FIGS. 2 and 3.

Figure 4:
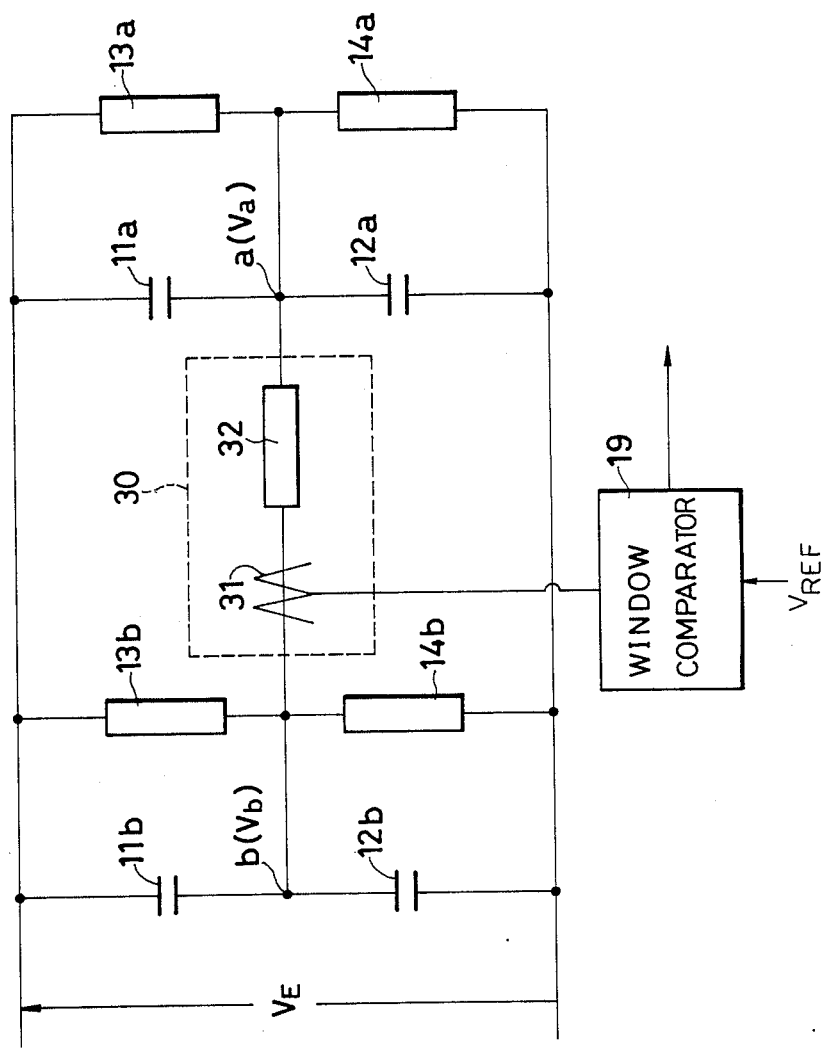
FIG. 4 is a circuit diagram of a fault detector, in a further embodiment, according to the present invention for detecting faults in a DC capacitor circuit.

Furthermore, the embodiments shown in FIGS. 2 and 3 employ the differential amplifier 16 and the insulating amplifier 26, respectively. However, the present invention is not limited to either of those embodiments. The junction a of the series-connected circuit elements and the junction b of the series connected circuit elements may be interconnected, as in the embodiment shown in FIG. 4, by the comparator 30 comprising a direct current transformer 31 and the resistor 32. In this circuit, a potential difference $|V_a - V_b|$ between the junctions a and b is detected when a failure occurs in the DC capacitor circuit. In FIGS. 2 and 4, like reference characters designate like or corresponding parts.

As apparent from what has been described hereinbefore, the fault detector for detecting faults in the DC capacitors of an inverter, according to the present invention comprises a comparison unit connected to the junctions of series-connected DC capacitors, to compare the potential difference between the junctions with a reference value, and is capable of immediately detecting faults, such as internal short-circuit and the variation of capacity, in any one of the series- and parallel-connected DC capacitors. Thus, the present invention has excellent effect for the rapid detection of faults in DC capacitors and, particularly, for the detection of the deterioration of the DC capacitors in performance, attributable to time aging.

What is claimed is:

1. A fault detector for detecting faults in a DC capacitor circuit comprising a plurality of parallel-connected capacitor circuits each having a group of series-connected DC capacitors for suppressing voltage pulsation and incorporated into the DC unit of an inverter for converting direct current into alternating current, each of said groups of series-connected capacitors having a junction between the capacitors of the group, which comprises:

a comparison means connected to a junctions of the series-connected DC capacitors of said plurality of the parrallel-connected capacitor circuits, to compare potentials at the respective junctions of the respective series-connected DC capacitors of the parallel-connected capacitor circuits to detect a difference between said potentials, said comparison means including means for detecting said difference in potential and the magnitude of said difference.

2. A fault detector as recited in claim 1, wherein said comparison means compares said difference in potential between the respective junctions of the respective series-connected DC capacitors of the parallel-connected capacitor circuits with a predetermined reference potential.

3. A fault detector as recited in claim 1, wherein said comparison means comprises:

a first comparator for comparing the potential of the junctions of the series-connected DC capacitors of said plurality of the parallel-connected capacitor circuits of the DC capacitor circuit to determine the difference in potential between said junctions; and a second comparator which compares the output signal of said first comparator, namely, said difference in potential, with a predetermined reference potential.

4. A fault detector as recited in claim 3, wherein said first comparator comprises a differential amplifier which receives the potentials of the junctions of the series-connected DC capacitors of the capacitor circuits through an input resistance, and provides an output signal corresponding to the said difference in potential between the junctions of the series-connected DC capacitors of the capacitor circuits.

5. A fault detector as recited in claim 3, wherein said second comparator changes its output value when an input signal, namely, the output signal of said first comparator, exceeds said predetermined reference potential.

6. A fault detector as recited in claim 3, wherein said second comparator is a window comparator.

7. A fault detector as recited in claim 3, wherein said second comparator is a level comparator which compares and detects positive and negative levels.

8. A fault detector as recited in claim 1, wherein said comparison means is provided in a line interconnecting the respective junctions of a series-connected circuit elements of a plurality of the series-connected sets of the circuit elements, and includes a direct current transformer which detects the potential difference between the junctions.

9. A fault detector as recited in claim 8 wherein said comparison means further includes a window comparator which compares the potential difference detected by the direct current transformer with a predetermined reference potential.

10. A fault detector for detecting faults in a DC capacitor circuits, which comprises:
a parallel-connected circuit comprising a plurality of series capacitor circuits each comprising a plurality of DC capacitors for suppressing voltage pulsation, and a plurality of series voltage dividing resistor circuits each comprising a plurality of voltage dividing resistors for leveling the potential differences across the individual DC capacitors, each of said series capacitor circuits including a junction between the capacitors comprising said series capacitor circuits and each of said series voltage dividing resistor circuits including a junction between said resistors comprising said voltage dividing resistor circuits; and
comparison means connected to the parallel-connected circuit so as to determine a difference in potential between potentials of two lines connected to the respective junctions of the DC capacitors of the series capacitor circuits and the respective junctions of the voltage dividing resistors of the series voltage dividing resistor circuits of the same two groups of the series capacitor circuits and the series voltage dividing resistor circuits, respectively.

11. A fault detector as recited in claim 10, wherein said comparison means comprises a first comparator which compares the respective potentials of the two lines connected to the respective junctions of the DC capacitors of the series capacitor circuits of the same two groups, and second comparator which compares said difference in potential, namely, the output of said first comparator circuit, and a predetermined potential.

12. A fault detector as recited in claim 11, wherein said first comparator circuit is a differential amplifier.

13. A fault detector as recited in claim 11, wherein said first comparator circuit is an isolating amplifier.

14. A fault detector as recited in claim 11, wherein said second comparator is a window comparator.

15. A fault detector as recited in claim 11, wherein said second comparator varies its level of output when the level of the output signal of said first comparator supplied thereto varies beyond an allowable range of variation on both sides of said predetermined reference potential.

* * * * *